(12) United States Patent
Iwase

(10) Patent No.: US 6,600,685 B2
(45) Date of Patent: Jul. 29, 2003

(54) SEMICONDUCTOR MEMORY DEVICE HAVING TEST MODE

(75) Inventor: Taira Iwase, Kawaski (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/053,363

(22) Filed: Jan. 17, 2002

(65) Prior Publication Data

US 2002/0167847 A1 Nov. 14, 2002

(30) Foreign Application Priority Data

May 14, 2001 (JP) ........................................ 2001-143588

(51) Int. Cl.⁷ .................................................. G11C 8/00
(52) U.S. Cl. ...................................... 365/201; 365/225.7
(58) Field of Search ........................ 365/201, 94, 225.7, 365/96, 230.06

(56) References Cited

U.S. PATENT DOCUMENTS

| | | | | |
|---|---|---|---|---|
| 5,233,564 A | * | 8/1993 | Ohshima et al. | ............. 365/201 |
| 5,500,824 A | * | 3/1996 | Fink | ............................. 365/201 |
| 5,717,652 A | * | 2/1998 | Ooishi | ........................ 365/201 |
| 5,905,690 A | * | 5/1999 | Sakurai et al. | ............... 365/201 |
| 5,925,141 A | * | 7/1999 | Ariki | .......................... 365/201 |
| 6,353,565 B2 | * | 3/2002 | Ito | ............................... 365/201 |

FOREIGN PATENT DOCUMENTS

| | | |
|---|---|---|
| JP | 05-325547 | 12/1993 |
| JP | 05-342858 | 12/1993 |
| JP | 05-342859 | 12/1993 |

* cited by examiner

Primary Examiner—Tan T. Nguyen
(74) Attorney, Agent, or Firm—Hogan & Hartson, LLP

(57) ABSTRACT

A semiconductor memory device includes a memory cell array from or to which data is read or written, an identification circuit to identify a particular signal which allows a particular operation that is not part of normal operations to read or write data from or to the memory cell array to be performed on the memory cell array, and a control circuit which performs the particular operation on the memory cell array when the particular signal is identified by the identification circuit.

6 Claims, 4 Drawing Sheets

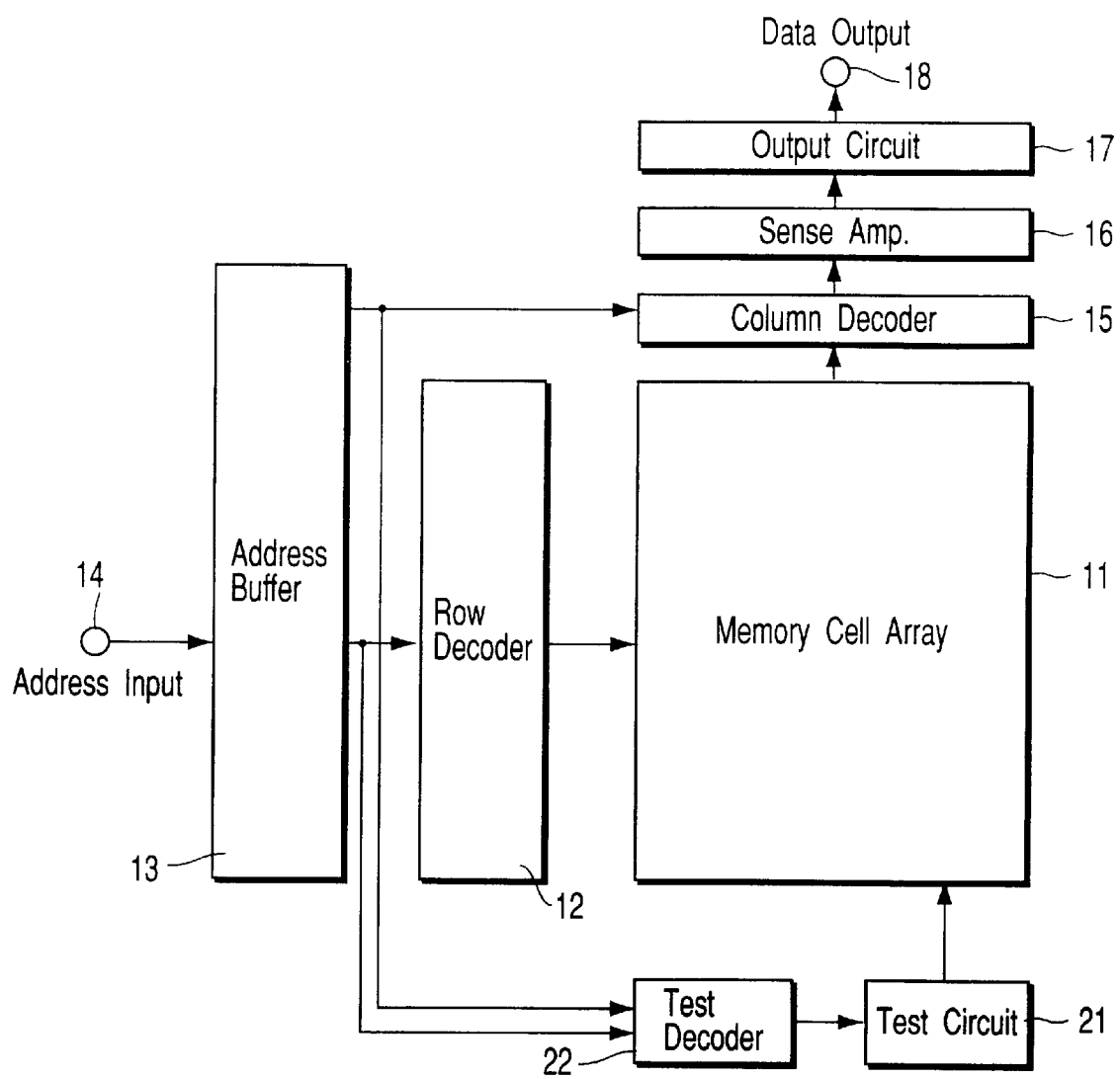
F I G. 1

| $\overline{CE}$ | $\overline{OE}$ | Mode |
|---|---|---|
| H | H | Standby |
| H | L | (Test) |
| L | H | Output High Z |
| L | L | Data Output |

SEMICONDUCTOR MEMORY DEVICE HAVING TEST MODE

CROSS-REFERENCE TO RELATED APPLICATIONS

This application is based upon and claims the benefit of priority from the prior Japanese Patent Application No. 2001-143588, filed May 14, 2001, the entire contents of which are incorporated herein by reference.

BACKGROUND OF THE INVENTION

1. Field of the Invention

The present invention relates to a semiconductor memory device having a test mode. More specifically, the present invention relates to a semiconductor memory device which allows its memory chip to perform, even after being packaged, a particular operation (for example, testing of the memory cell array) that is not part of its normal operations.

2. Description of the Related Art

Conventionally, semiconductor memory devices are supplied with signals at test pads formed on their respective memory chips at wafer test time. By this means, various tests are run. For example, the memory cell array is subjected to a given operation that is not part of normal memory operations. Such tests can be carried out in a short time. However, such tests cannot be made on packaged final products. For this reason, the demand has increased for developing semiconductor memory devices on which tests can be carried out even after packaging.

To meet such a demand, a semiconductor memory device has recently been developed which is configured to automatically enter a test mode when a high voltage is applied to an input pin. The semiconductor memory device has a high-voltage detection circuit connected to its input pin to detect the application of a voltage higher than the normal operating voltage (Vcc). For example, with Vcc=3.3 V, a test is carried out when a voltage of not less than 6.5 V is applied to the input pin. With such a semiconductor memory device, packaged final products can be tested without using a special input pin. Accordingly, this kind of semiconductor memory device has come into widespread use.

However, the semiconductor memory device as described above has the following problems associated with it:

The switching voltage of the high-voltage detection circuit is subject to variation due to variations in process parameters such as the threshold voltage, Vth. Therefore, in the worst case there arises the possibility that a test may be carried out in error due to noise input during the normal memory operation.

As memory cells are made smaller as a result of advances in fine pattern technology, the gate insulating film of the transistors of each of memory cell becomes thinner. Therefore, the adverse effect on reliability of applying a high voltage to the input pin has become a problem. It is expected that the gate insulating film will become increasingly thinner in future. Thus, the conventional method of applying a high voltage to the input pin is not desirable from the viewpoint of reliability.

As described above, a semiconductor memory device has conventionally been developed which can be tested even after being packaged by applying a high voltage to the input pin. However, there arises the possibility of malfunction due to noise and reliability becomes a problem as the thickness of the gate insulating film is reduced.

BRIEF SUMMARY OF THE INVENTION

According to an aspect of the present invention, there is provided a semiconductor memory device comprising: a memory cell array from or to which data is read or written; an identification circuit to identify a particular signal which allows a particular operation that is not part of normal operations to read or write data from or to the memory cell array to be performed on the memory cell array; and a control circuit which performs the particular operation on the memory cell array when the particular signal is identified by the identification circuit.

BRIEF DESCRIPTION OF THE DRAWINGS

FIG. 1 is a block diagram of a semiconductor memory device according to a first embodiment of the present invention;

DETAILED DESCRIPTION OF THE INVENTION

Figure 2:
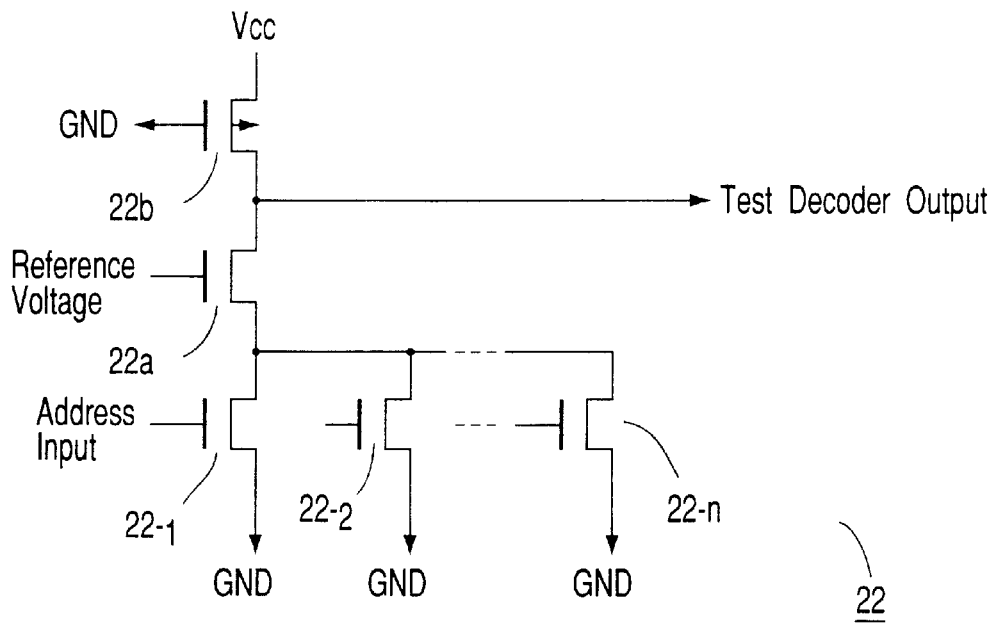
FIG. 2 is a schematic circuit diagram of a test decoder in the semiconductor memory device of FIG. 1.

Embodiments of the invention will be described hereinafter with reference to the accompanying drawings.

[First Embodiment]

FIG. 1 illustrates in block diagram form an arrangement of a semiconductor memory device according to a first embodiment of the present invention. Note that only the main parts of the memory chip are illustrated here.

In FIG. 1, a memory cell array 11 has a plurality of memory cells each of which has corresponding row and column addresses by which to access it. Normal memory operations are performed on the memory cell array 11 on a cell-by-cell basis. That is, data is read from or written to each memory cell.

To the memory cell array 11 is input a row address from a row decoder 12, which decodes an address input from an address buffer 13 and produces a row address corresponding to that address input. The address buffer 13 holds an address input applied to an input pin 14.

The memory cell array 11 is also connected to receive a column address from a column decoder 15, which decodes an address input from the address buffer 13 to produce a column address corresponding to that address input. To the column decoder 15 is connected a sense amplifier 16, which amplifies data read from the memory cell array 11. The data is applied to the sense amplifier 16 through the column decoder 15. To the sense amplifier 16 is connected an output circuit 17, which externally provides read data amplified by the sense amplifier 16 through an output pin 18 as data output.

To the memory cell array 11 is further connected a test circuit (control circuit) 21, which performs a particular operation that is not part of normal memory operations, e.g., a test, on the memory cell array 11. For example, the test can be one to reject defective cells in an efficient manner. In addition, the test can be carried out in short time.

To the test circuit 21 is connected a test decoder (identification circuit) 22, which decodes an address input as a particular signal. The address input allows a test to be performed on the memory cell array 11, i.e., the so-called test mode to be entered. In this embodiment, as the address input to the test decoder 22, use is made of an excess address that is not used in accessing memory cells in normal memory operations.

In general, a storage capacity of $2^N$ bits (where N is an integer) is standard with the memory cell array 11; however, it is seldom that the storage capacity is fully used. On the contrary, in most cases a part of the memory cell area is not used. Some memory products, particularly custom-designed mask ROMs, often have a storage capacity other than $2^N$ bits according to the user's requirements. For example, a mask ROM having a storage capacity of 48 Mbits (3 megawords× 16 bits) is provided with 22 input pins as address inputs. With this mask ROM, there are excess addresses corresponding to 16 megabits in comparison with a 64-Mbit (4 megawords×16 bits) ROM which is provided with 22 input pins and has a storage capacity of $2^{22}$ bits.

Therefore, the excess addresses are used as address inputs for entering the test mode. Namely, an excess address or set of addresses is used as a particular signal. This allows tests to be performed as in normal memory operations even in packaged final products and without the need for a special input pin or high-voltage detection circuit.

FIG. 2 shows an arrangement of the test decoder 22. N-channel MOS transistors 22-1, 22-2, . . . , 22-n, corresponding in number to the input pins, have their respective gates connected to receive address inputs, their sources connected together to ground potential (GND), and their drains connected together to the source of an N-channel MOS transistor 22a. The transistor 22a has its gate connected to a reference voltage and its drain connected to the drain of a P-channel MOS transistor 22b which has its gate connected to ground potential and its source connected to the supply voltage (Vcc). The decoder output is taken at the common drains of the transistors 22a and 22b.

In such an arrangement, when all address inputs are 1s, i.e., when the excess address are all 1s, the particular signal is detected and produced. As a result, as the output of the test decoder 22, a signal at a high level is applied to the test circuit 21.

As described above, the present embodiment allows packaged final products to be subjected to tests without the need for a special input pin or high-voltage detection circuit. That is, the test mode can be entered by externally applying excess addresses which are not used to access memory cells. In this way, the necessity for a special input pin and high-voltage detection circuit to enter the test mode is eliminated, allowing packaged final products to be tested with ease. In addition, not only can malfunction due to noise be prevented, but also the problem of reliability resulting from reducing the thickness of the gate insulating film can be eliminated.

Although the first embodiment has been described in terms of a mask ROM having excess addresses, the principles of the invention are also applicable to read-only memories having a storage capacity of, say, $2^N$ bits. Even with read-only memories which are used to store programs and have a storage capacity of, say, 64 Mbits (4 megawords×16 bits), in practice only about 50 Mbits of storage capacity are used. It is rare to use all the storage capacity. In the case of such read only memories, addresses for memory cells in unused areas are used as the particular signal. Such a configuration as also allows tests to be carried out by the test circuit 21 after packaging.

The test decoder is not limited to the above arrangement and can be modified in various ways.

[Second Embodiment]

Figure 3:
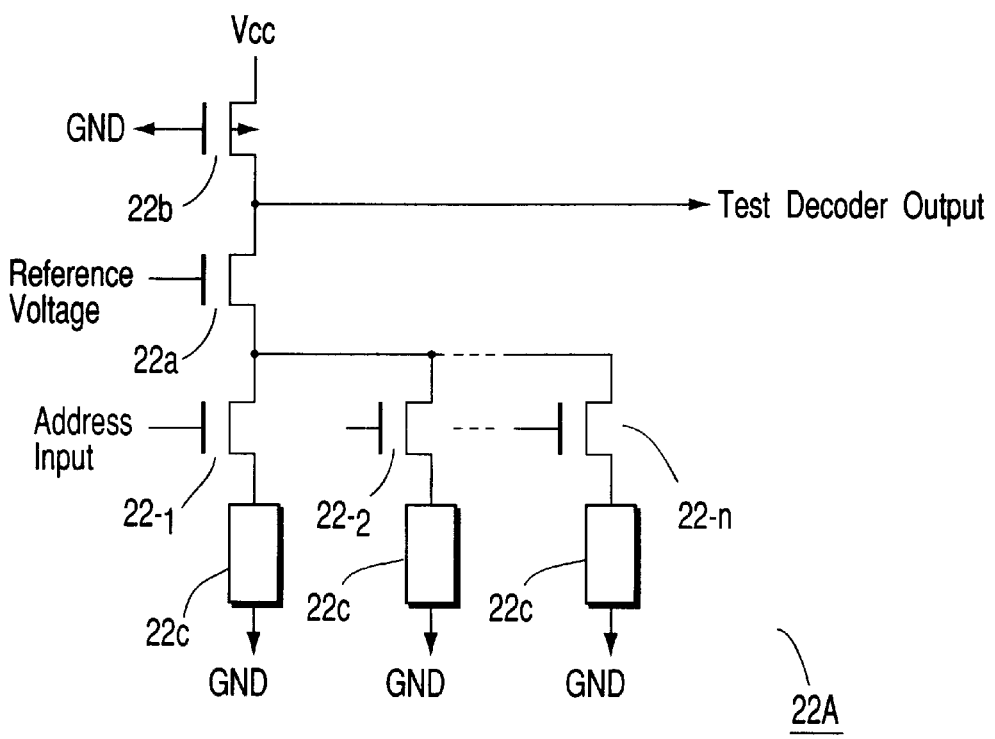
FIG. 3 is a schematic circuit diagram of a test decoder according to a second embodiment of the present invention.

FIG. 3 shows an arrangement of a programmable test decoder according to a second embodiment of the present invention. In FIG. 3, parts corresponding to those in FIG. 2 are denoted by like reference numerals and their descriptions are omitted.

In this test decoder 22A, each of the N-channel MOS transistors 22-1, 22-2, . . . , 22-n has its source connected to ground by a corresponding fuse 22c. In such an arrangement, these fuses 22c are selectively blown by laser irradiation or current according to unused addresses, allowing the particular signal to be set up and detected arbitrarily.

[Third Embodiment]

Figure 4:
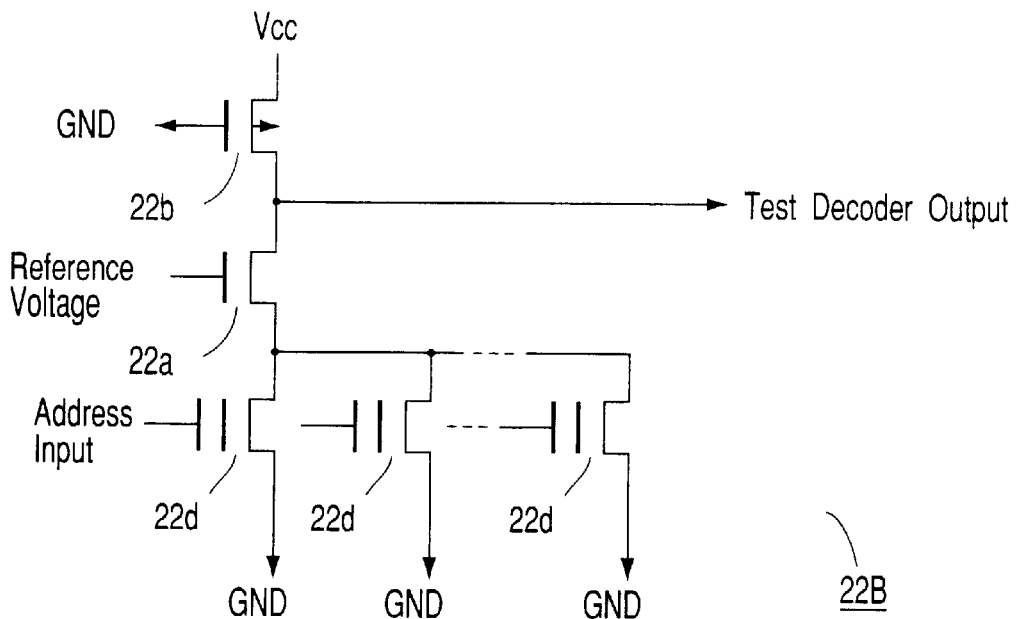
FIG. 4 is a schematic circuit diagram of a test decoder according to a third embodiment of the present invention.

FIG. 4 shows an arrangement of a programmable test decoder according to a third embodiment of the present invention. In FIG. 4, parts corresponding to those in FIG. 2 are denoted by like reference numerals and their descriptions are omitted.

In this test decoder 22B, the N-channel MOS transistors 22-1, 22-2, . . . , 22-n are replaced by programmable nonvolatile memory elements 22d such as EPROMs and EEPROMs. In such an arrangement, these memory elements 22d are selectively written to according to unused addresses, allowing the particular signal to be set up and detected arbitrarily.

[Fourth Embodiment]

Figure 5:
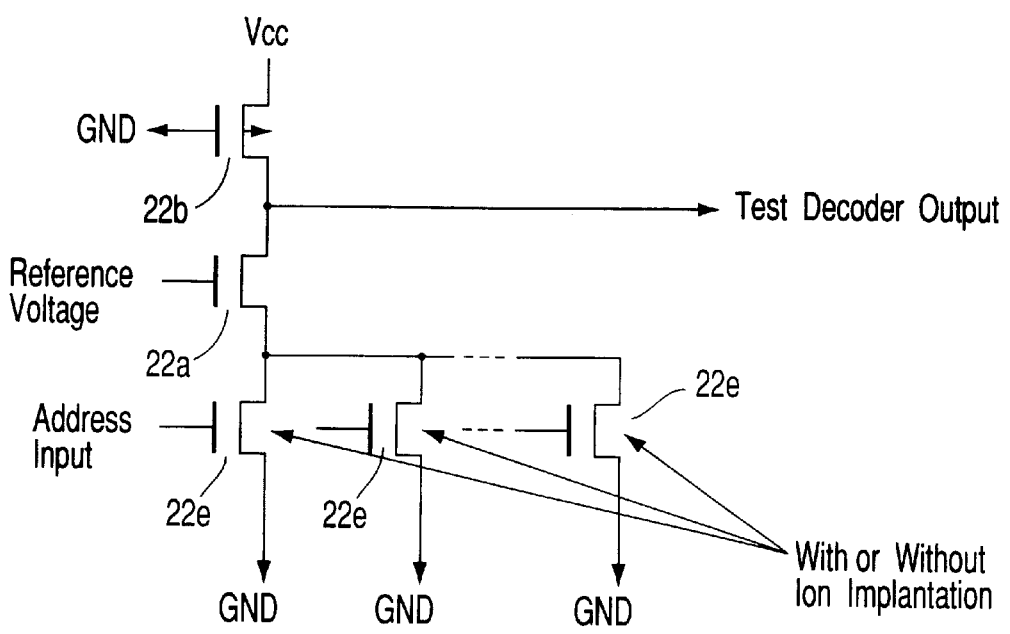
FIG. 5 is a schematic circuit diagram of a test decoder according to a fourth embodiment of the present invention.

FIG. 5 shows an arrangement of a test decoder according to a fourth embodiment of the present invention. In the fourth embodiment, the test decoder is configured such that, when unused addresses are known at wafer manufacture time, it can be programmed according to the unused addresses. In FIG. 5, parts corresponding to those in FIG. 2 are denoted by like reference numerals and their descriptions are omitted.

In this test decoder 22C, the N-channel MOS transistors 22-1, 22-2, . . . , 22-n are replaced by mask ROM elements 22e. In such an arrangement, these memory elements 22e are selectively written to through ion implantation according to unused addresses, allowing the particular signal to be set up and detected arbitrarily.

In this embodiment, the particular signal is not limited to address inputs. For example, use may also be made of a control input signal, such as a chip enable signal /CE or an output enable signal /OE, that controls the state of the memory cell array 11.

[Fifth Embodiment]

Figures 6, 7:
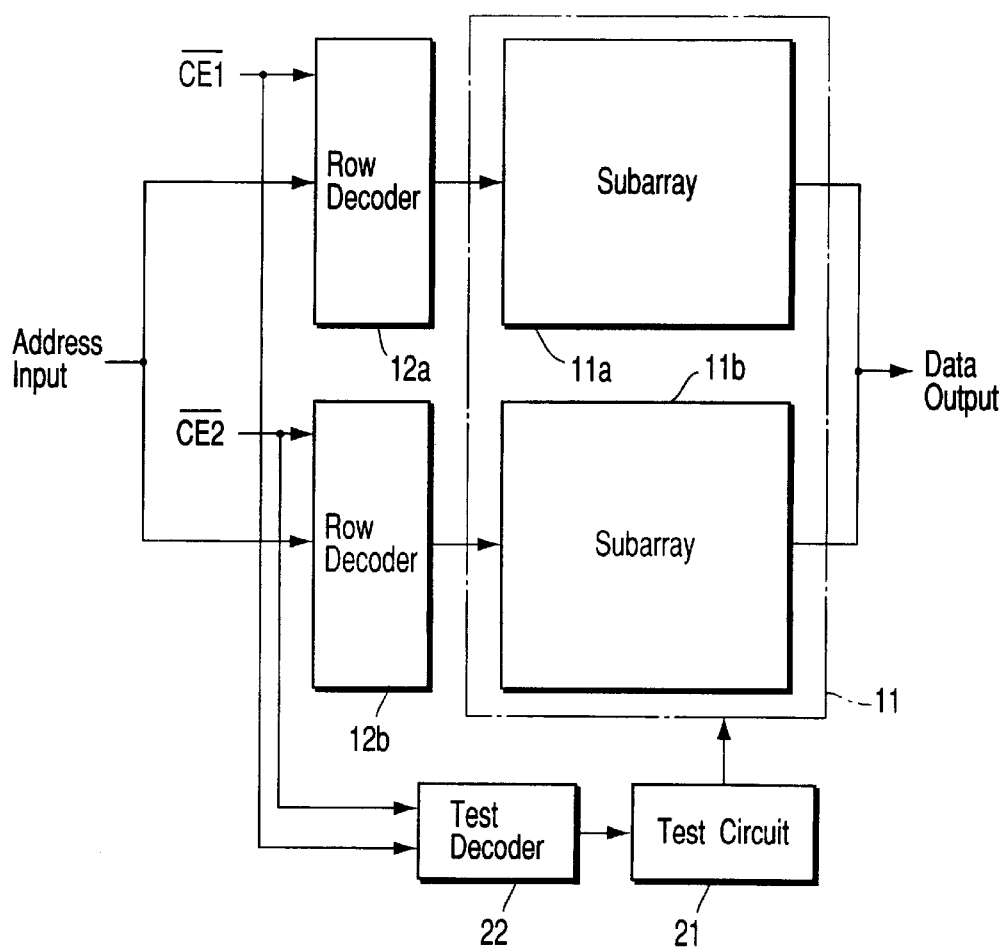
FIG. 6 is a diagram for use in explaining a memory system having a chip enable control pin and an output enable control pin in accordance with a fifth embodiment of the present invention.
FIG. 7 is a diagram for use in explaining a memory system in which the memory cell array is divided into a plurality of subarrays in accordance with a sixth embodiment of the present invention.

FIG. 6 is a diagram for use in explaining a memory system having a chip enable control pin and an output enable control pin as a fifth embodiment of the present invention.

In such a memory system, there are four combinations in level of the chip enable signal /CE and the output enable signal /OE as shown in FIG. 6. In this system, it is assumed that such a combination as the chip enable signal being at a high level (H: chip disable state) when the output enable signal is at a low level (L: output enabled state) is impossible. This impossible combination can then be detected as the particular signal. Such a configuration as also allows tests to be carried out by the test circuit 21 after packaging.

In a system in which the sequence in which the chip enable signal /CE and the output enable signal /OE are input has been determined, these signals can be detected as the particular signal when they are input in a sequence different from the said sequence in normal operations. For example, in a system in which the chip enable signal /CE is first input and then the output enable signal /OE is input, the particular signal is detected when the output enable signal /OE is first input and then the chip enable signal /CE is input. Such a configuration as also allows tests to be carried out by the test circuit 21 after packaging.

[Sixth Embodiment]

FIG. 7 shows a memory system in which the memory cell array 11 is composed of two subarrays 11a and 11b according to a sixth embodiment of the present invention. Here, portions associated with row addresses are mainly illustrated.

In the case of a memory system in which the subarrays 11a and 11b are enabled (selected) by chip enable signals /CE1 and /CE2, respectively, the subarrays 11a and 11b will not be enabled simultaneously. In this system, therefore, a combination of the chip enable signals /CE1 and /CE2 when they are both at a low level (chip select level) is detected as the particular signal. Such a configuration also allows tests to be carried out by the test circuit 21 after packaging.

In a system in which the sequence in which the chip enable signals /CE1 and /CE2 are input has been determined, these signals can be detected as the particular signal when they are input in a sequence different from the said sequence in normal operations. Such a configuration as also allows tests to be carried out by the test circuit 21 after packaging.

The memory system is not limited to the one in which the memory cell array is composed of two subarrays. The principles of the invention are also applicable to a memory system incorporating a plurality of memory cell arrays.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:

a memory cell array from or to which data is read or written;

an identification circuit to identify a particular signal which allows a particular operation that is not part of normal operations to read or write data from or to said memory cell array to be performed on said memory cell array; and a control circuit which performs said particular operation on said memory cell array when said particular signal is identified by said identification circuit;

wherein said identification circuit has fuses each of which corresponds to an address input, said fuses being selectively blown in order to allow an arbitrary address to be detected.

2. A semiconductor memory device comprising:

a memory cell array from or to which data is read or written;

an identification circuit to identify a particular signal which allows a particular operation that is not part of normal operations to read or write data from or to said memory cell array to be performed on said memory cell array; and a control circuit which performs said particular operation on said memory cell array when said particular signal is identified by said identification circuit;

wherein said identification circuit has programmable nonvolatile memory elements each of which corresponds to an address input, said programmable nonvolatile memory elements being selectively written to in order to allow an arbitrary address to be detected.

3. A semiconductor memory device comprising:

a memory cell array from or to which data is read or written;

an identification circuit to identify a particular signal which allows a particular operation that is not part of normal operations to read or write data from or to said memory cell array to be performed on said memory cell array; and a control circuit which performs said particular operation on said memory cell array when said particular signal is identified by said identification circuit;

wherein said identification circuit has programmable mask ROM elements each of which corresponds to an address input, said programmable mask ROM elements being selectively written to in order to allow an arbitrary address to be detected.

4. A semiconductor memory device comprising:

a memory cell array from or to which data is read or written;

an identification circuit to identify a particular address which allows a particular operation that is not part of normal operations to read or write data from or to said memory cell array to be performed on said memory cell array, said identification circuit having fuses each of which corresponds to the particular address, and said fuses being selectively blown in order to allow an arbitrary particular address to be detected; and a control circuit which performs said particular operation on said memory cell array when said particular address is identified by said identification circuit.

5. A semiconductor memory device comprising:

a memory cell array from or to which data is read or written;

an identification circuit to identify a particular address which allows a particular operation that is not part of normal operations to read or write data from or to said memory cell array to be performed on said memory cell array, said identification circuit having programmable nonvolatile memory elements each of which corresponds to the particular address, and said programmable nonvolatile memory elements being selectively written in order to allow an arbitrary particular address to be detected; and a control circuit which performs said particular operation on said memory cell array when said particular address is identified by said identification circuit.

6. A semiconductor memory device comprising:

a memory cell array from or to which data is read or written;

an identification circuit to identify a particular address which allows a particular operation that is not part of normal operations to read or write data from or to said memory cell array to be performed said memory cell array, said identification circuit having programmable mask ROM elements each of which corresponds to the particular address, and said programmable mask ROM elements being selectively written in order to allow an arbitrary particular address to be detected; and a control circuit which performs said particular operation on said memory cell array when said particular address is identified by said identification circuit.

* * * * *